United States Patent
Lee et al.

(10) Patent No.: US 10,418,317 B2
(45) Date of Patent: Sep. 17, 2019

(54) FAN-OUT SEMICONDUCTOR PACKAGE

(71) Applicant: SAMSUNG ELECTRONICS CO., LTD., Suwon-si (KR)

(72) Inventors: Sang Kyu Lee, Suwon-Si (KR); Jeong Ho Lee, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/037,670

(22) Filed: Jul. 17, 2018

(65) Prior Publication Data

US 2019/0131232 A1 May 2, 2019

(30) Foreign Application Priority Data

Oct. 26, 2017 (KR) .................. 10-2017-0140365

(51) Int. Cl.
*H01L 23/498* (2006.01)
*H01L 23/31* (2006.01)
(Continued)

(52) U.S. Cl.
CPC .... *H01L 23/49838* (2013.01); *H01L 23/3128* (2013.01); *H01L 23/49816* (2013.01);
(Continued)

(58) Field of Classification Search
CPC .......... H01L 23/49838; H01L 25/0655; H01L 24/16; H01L 23/49816; H01L 25/16; H01L 23/49822; H01L 23/49827; H01L 23/3128
See application file for complete search history.

(56) References Cited

U.S. PATENT DOCUMENTS 5,998,875 A * 12/1999 Bodo .................. H01L 21/6835
257/688
9,337,116 B2 * 5/2016 Pagaila ............... H01L 23/3128
(Continued)

FOREIGN PATENT DOCUMENTS

JP    2004-140134 A    5/2004
JP       4771608 B2    9/2011
(Continued)

OTHER PUBLICATIONS

Communication dated Apr. 8, 2019, issued by the Taiwan Patent Office in counterpart Taiwanese Patent Application No. 107124504.

*Primary Examiner* — John P. Dulka
(74) *Attorney, Agent, or Firm* — Sughrue Mion, PLLC

(57) ABSTRACT

A fan-out semiconductor package includes: a frame including insulating layers, wiring layers, and connection via layers, and having a first recess portion and a first stopper layer disposed on a bottom surface of the first recess portion; a semiconductor chip disposed in the first recess portion and having connection pads, an active surface on which the connection pads are disposed, and an inactive surface opposing the active surface and disposed on the first stopper layer; an encapsulant covering at least portions of the semiconductor chip and filling at least portions of the first recess portion; and a connection member disposed on the frame and the active surface of the semiconductor chip and including a redistribution layer electrically connecting the wiring layers of the frame and the connection pads of the semiconductor chip to each other.

22 Claims, 15 Drawing Sheets

(51) Int. Cl.
  *H01L 25/16* (2006.01)
  *H01L 23/00* (2006.01)
  *H01L 25/065* (2006.01)

(52) U.S. Cl.
  CPC .. *H01L 23/49822* (2013.01); *H01L 23/49827* (2013.01); *H01L 24/16* (2013.01); *H01L 25/0655* (2013.01); *H01L 25/16* (2013.01); *H01L 2224/16227* (2013.01)

(56) References Cited

U.S. PATENT DOCUMENTS

| | | | |
|---|---|---|---|
| 9,666,571 B2* | 5/2017 | Kao | H01L 24/73 |
| 9,831,142 B2* | 11/2017 | Baek | H01L 24/16 |
| 10,109,588 B2* | 10/2018 | Jeong | H01L 23/5389 |
| 2009/0160071 A1 | 6/2009 | Shen | |
| 2012/0104623 A1* | 5/2012 | Pagaila | H01L 23/13 |
| | | | 257/774 |
| 2013/0001797 A1* | 1/2013 | Choi | H01L 25/105 |
| | | | 257/774 |
| 2013/0032390 A1* | 2/2013 | Hu | H01L 23/147 |
| | | | 174/266 |
| 2013/0270580 A1* | 10/2013 | Choi | H01L 51/524 |
| | | | 257/82 |
| 2014/0338955 A1* | 11/2014 | Park | H05K 1/0271 |
| | | | 174/250 |
| 2015/0055312 A1* | 2/2015 | Lee | B23K 1/0016 |
| | | | 361/783 |
| 2015/0318263 A1* | 11/2015 | Yu | H01L 23/36 |
| | | | 257/774 |
| 2015/0364409 A1* | 12/2015 | Fontana | H01L 23/3677 |
| | | | 257/692 |
| 2015/0373833 A1* | 12/2015 | Baek | H05K 3/4682 |
| | | | 174/250 |
| 2016/0155702 A1* | 6/2016 | Chen | H01L 23/5226 |
| | | | 257/774 |
| 2016/0302308 A1* | 10/2016 | Lee | H05K 3/4694 |
| 2017/0110413 A1 | 4/2017 | Chen et al. | |
| 2017/0162554 A1* | 6/2017 | Clevenger | H01L 25/18 |
| 2017/0263573 A1* | 9/2017 | Kim | H01L 24/20 |
| 2018/0005568 A1* | 1/2018 | Kim | G09G 3/3208 |
| 2018/0053723 A1* | 2/2018 | Hu | H01L 23/49827 |
| 2018/0076106 A1* | 3/2018 | Nishimura | H01L 21/4803 |
| 2018/0240729 A1* | 8/2018 | Kim | H01L 25/105 |

FOREIGN PATENT DOCUMENTS

| | | |
|---|---|---|
| KR | 10-2017-0071826 A | 6/2017 |
| TW | 201724387 A | 7/2017 |

\* cited by examiner

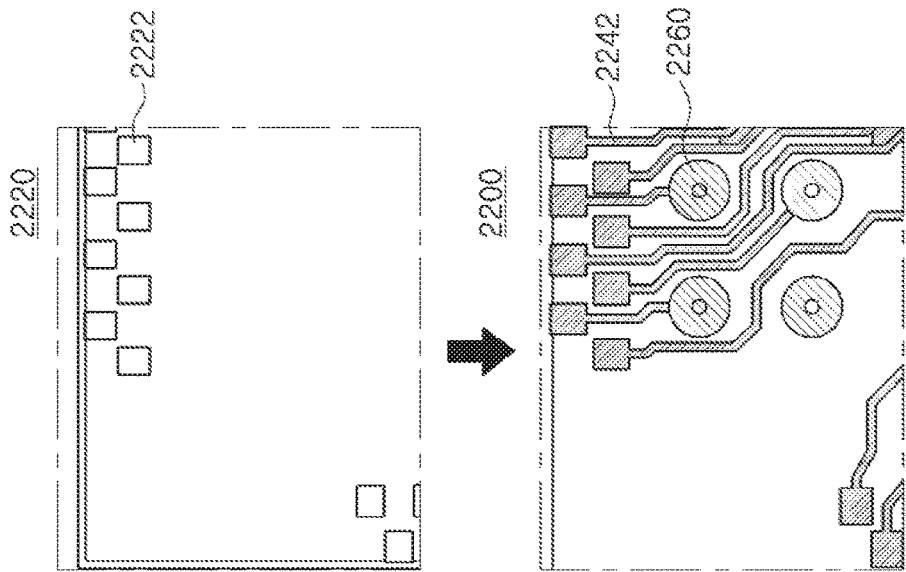
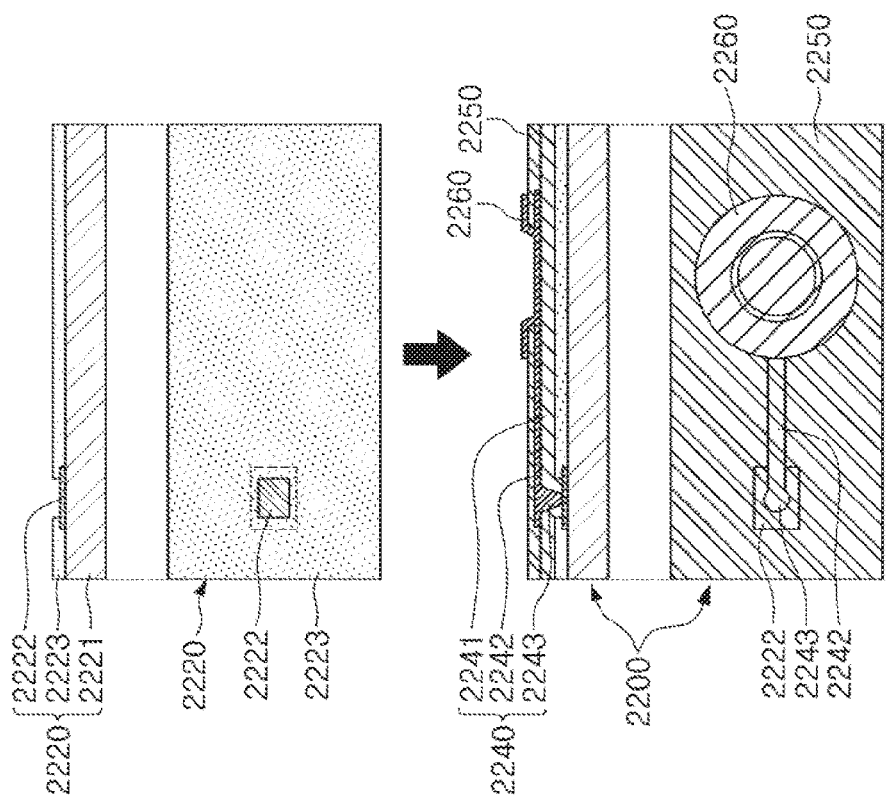
FIG. 3B
FIG. 3A

FAN-OUT SEMICONDUCTOR PACKAGE

CROSS-REFERENCE TO RELATED APPLICATION(S)

This application claims benefit of priority to Korean Patent Application No. 10-2017-0140365 filed on Oct. 26, 2017 in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package, having a compact size while including a plurality of pins, has been demanded.

One type of semiconductor package technology suggested to satisfy the technical demand, described above, is a fan-out semiconductor package. Such a fan-out package has a compact size and may allow a plurality of pins to be implemented by redistributing connection terminals outwardly of a region in which a semiconductor chip is disposed.

Such a semiconductor package may be used as a multichip package, which includes a plurality of semiconductor chips and passive elements. When chips in the multichip package have different thicknesses, a step portion may be generated due to a thickness difference between the chips, and structural stability of the multichip package may thus be deteriorated. Such a problem due to the height difference between the elements may further be intensified when warpage of the multichip package is generated.

SUMMARY

An aspect of the present disclosure may provide a fan-out semiconductor package of which structural stability may be improved even in the case that a plurality of chips having different thicknesses are used together.

According to an aspect of the present disclosure, a fan-out semiconductor package may include: a frame including a plurality of insulating layers, a plurality of wiring layers disposed on the plurality of insulating layers, and a plurality of connection via layers penetrating through the plurality of insulating layers and electrically connecting the plurality of wiring layers to each other, and having a first recess portion and a first stopper layer disposed on a bottom surface of the first recess portion; a semiconductor chip disposed in the first recess portion and having connection pads, an active surface on which the connection pads are disposed, and an inactive surface opposing the active surface and disposed on the first stopper layer; an encapsulant covering at least portions of the semiconductor chip and filling at least portions of the first recess portion; and a connection member disposed on the frame and the active surface of the semiconductor chip and including a redistribution layer electrically connecting the plurality of wiring layers of the frame and the connection pads of the semiconductor chip to each other. The frame may further have a second recess portion spaced apart from the first recess portion and a second stopper layer disposed on a bottom surface of the second recess portion. In this case, a first electronic component may be disposed in the second recess portion having a lower surface disposed on the second stopper layer. The first electronic component may be electrically connected to the connection pads of the semiconductor chip through the redistribution layer of the connection member.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
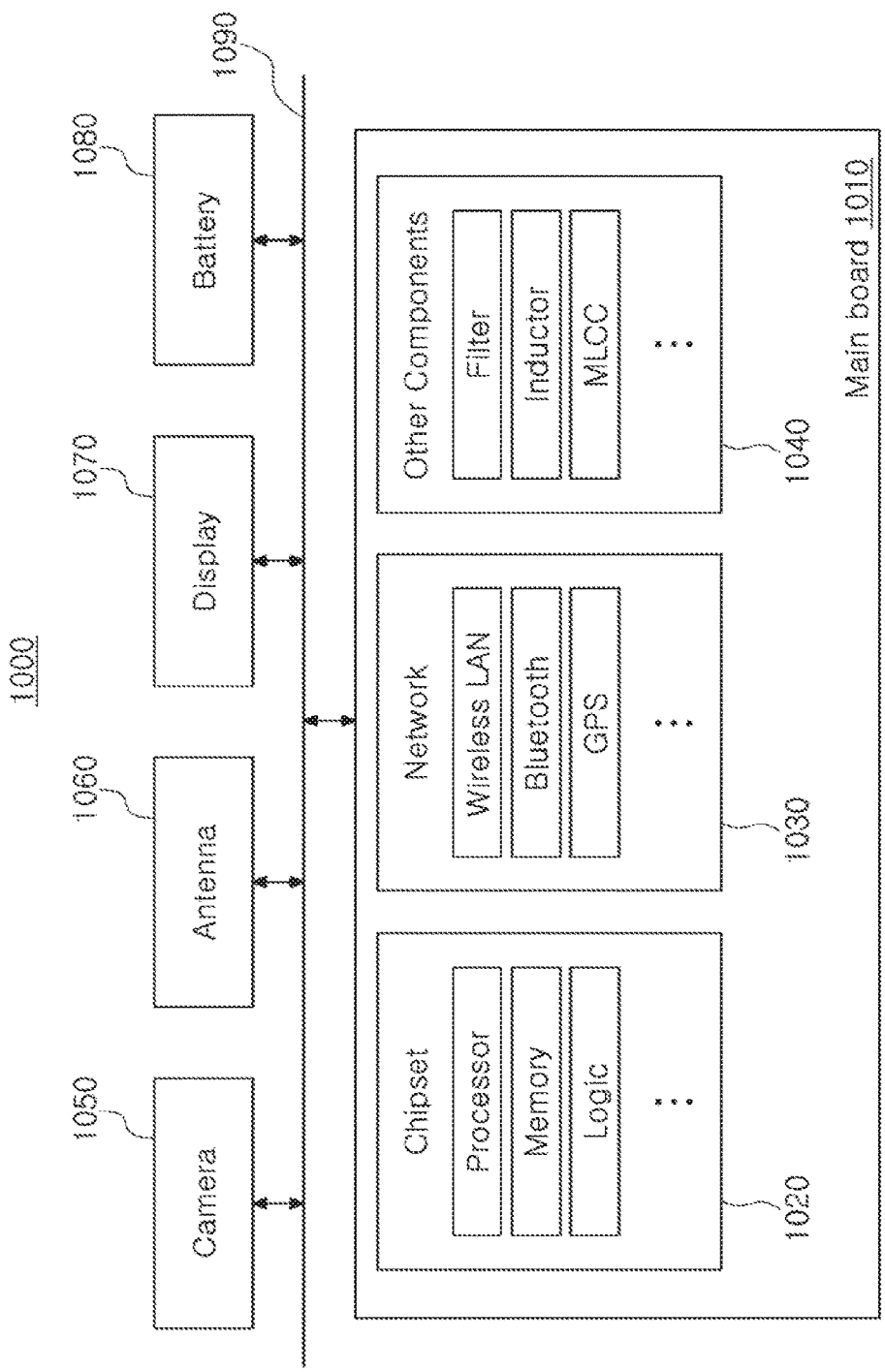
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
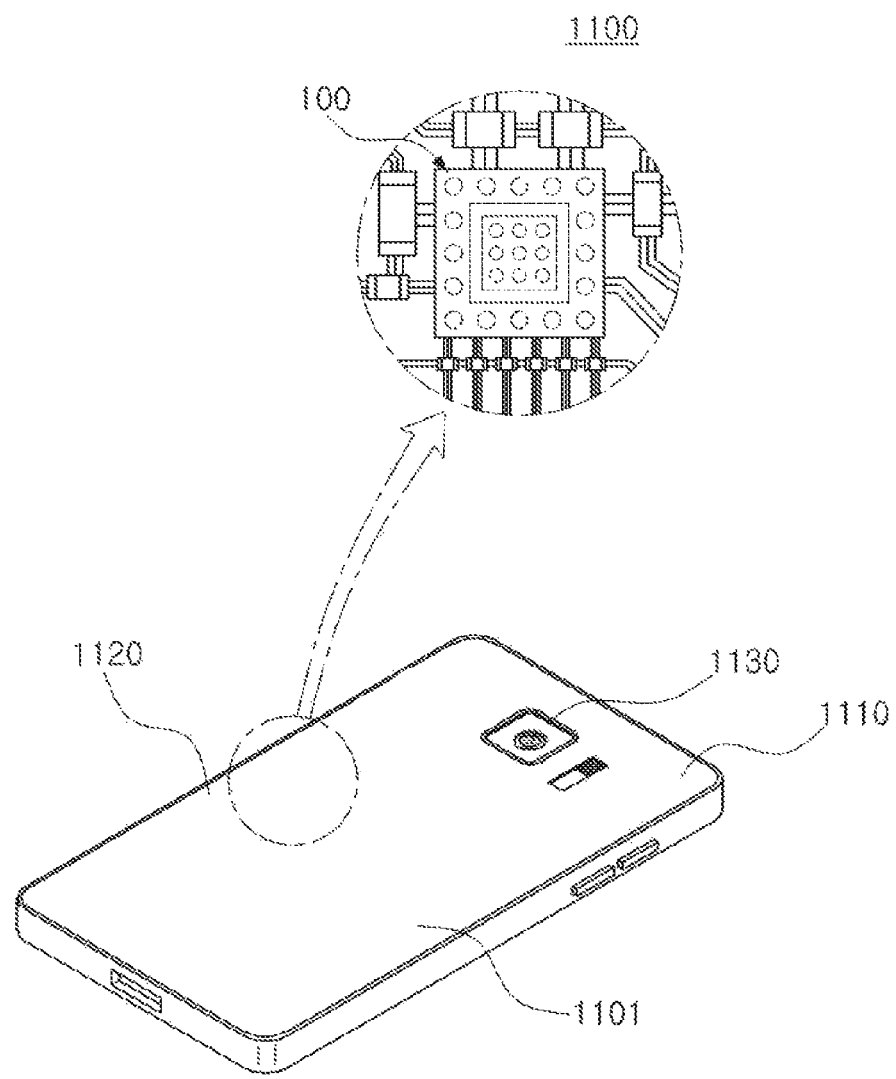
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

FIGS. 3A and 3B are schematic cross-sectional views illustrating states of a fan-in semiconductor package before and after being packaged.

Figure 4:
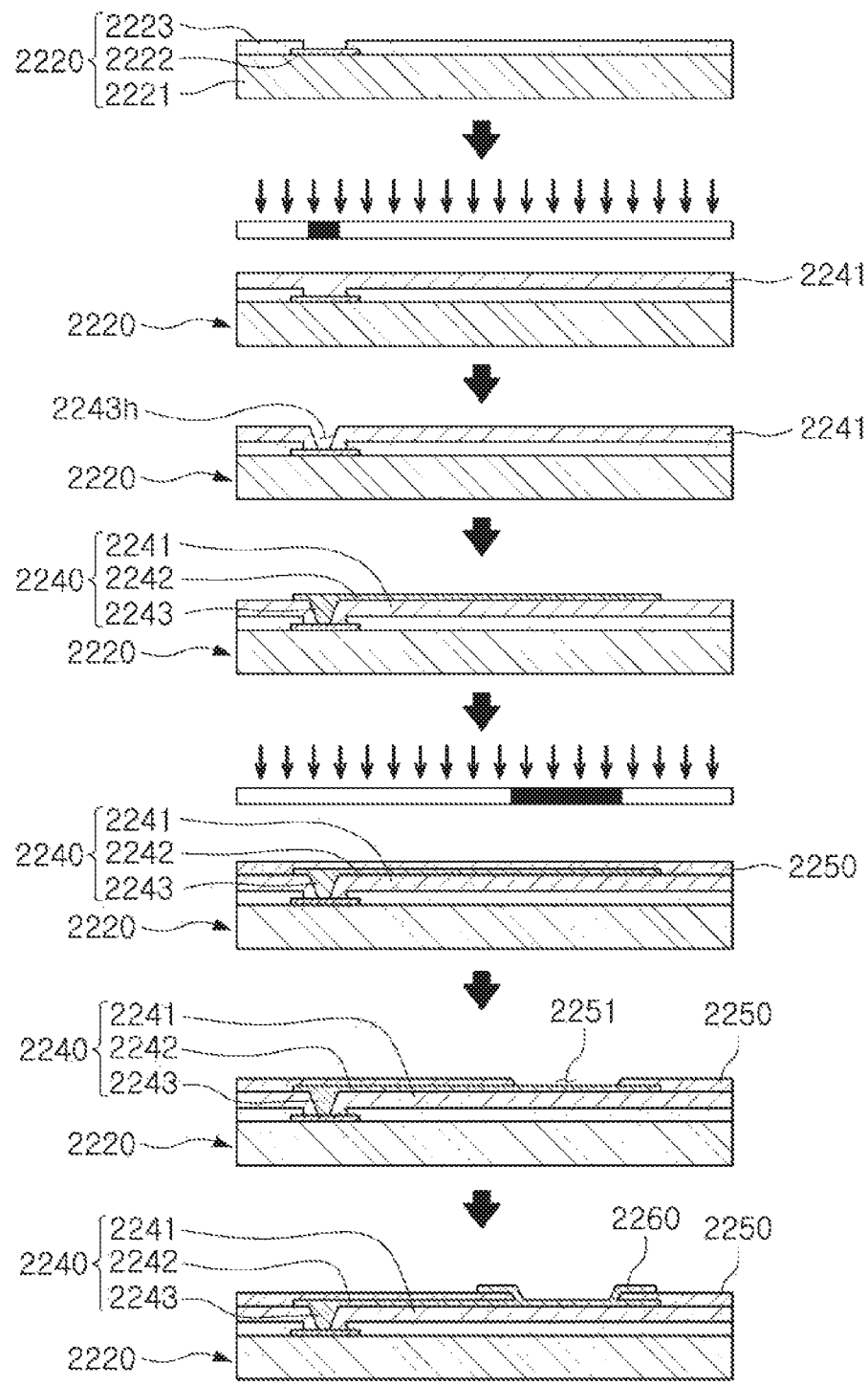
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
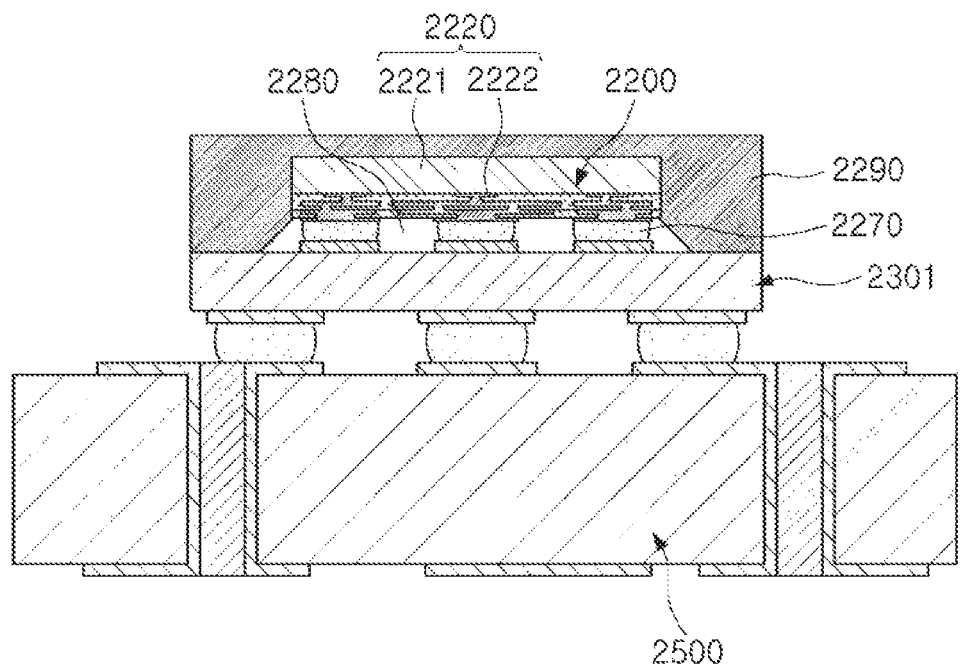
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
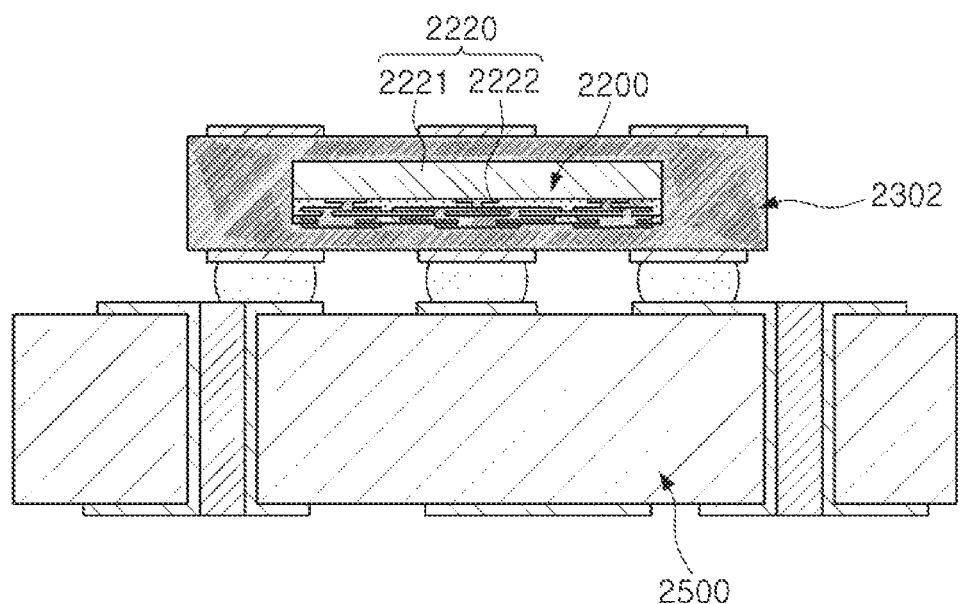
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
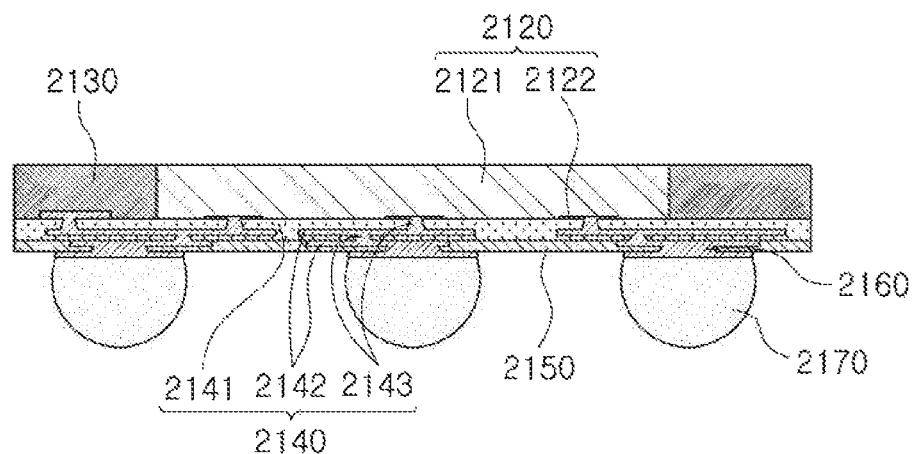
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
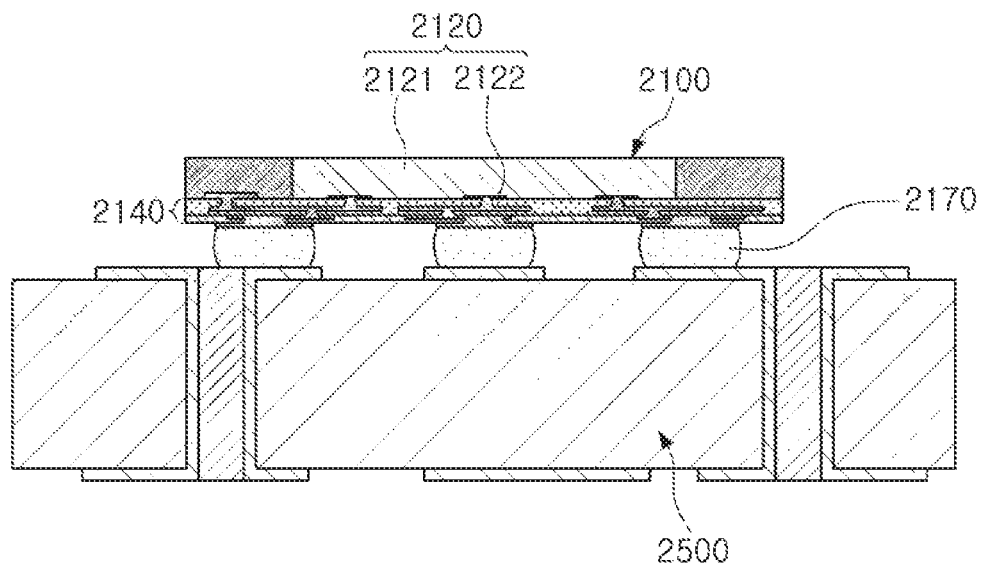
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness less than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package having a structure in which an influence due to generation of a step portion between a plurality of chips is decreased when the fan-out semiconductor package includes the plurality of chips will hereinafter be described with reference to the drawings.

Figure 9:
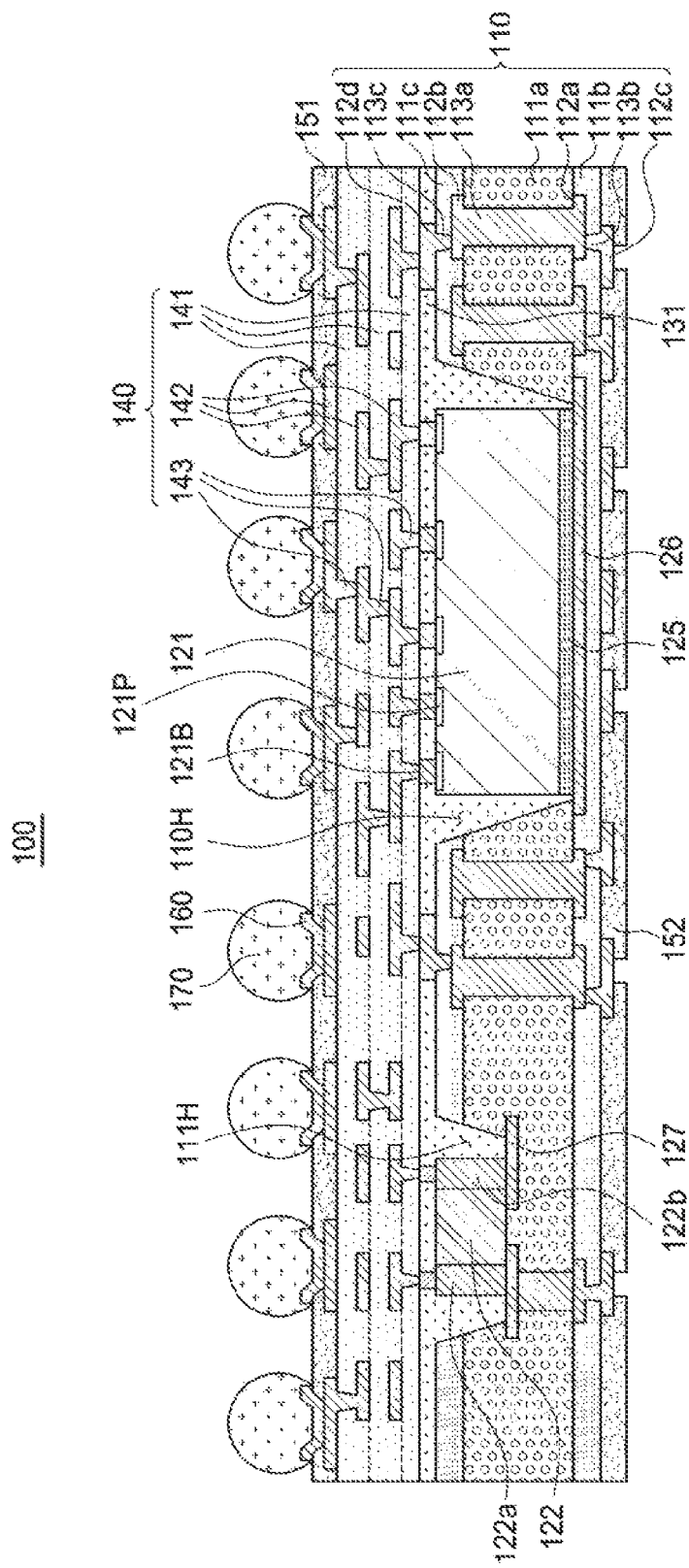
FIG. 9 is a schematic cross-sectional view illustrating an example of a fan-out semiconductor package.
Figure 10:
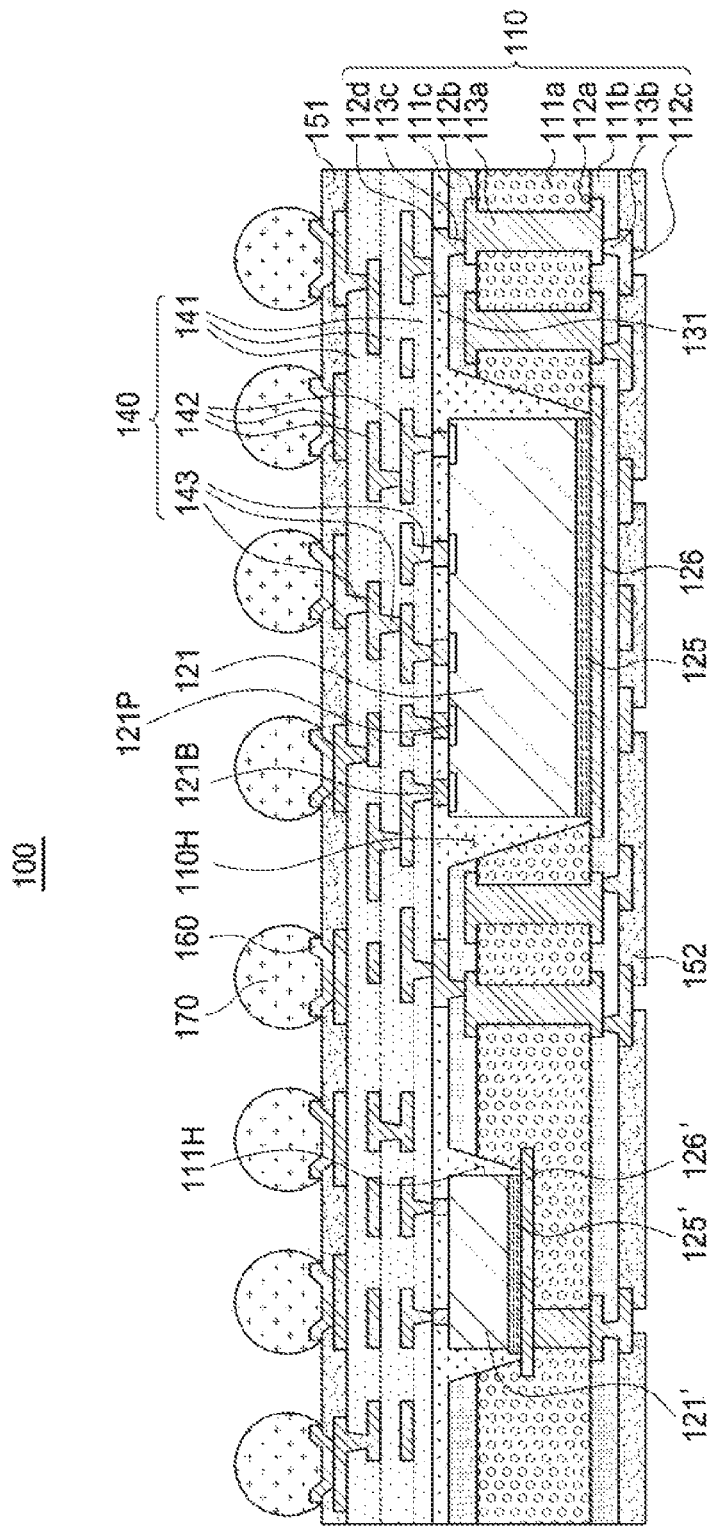
FIGS. 10 through 13 are schematic cross-sectional views illustrating fan-out semiconductor packages according to modified exemplary embodiments.
Figure 11:
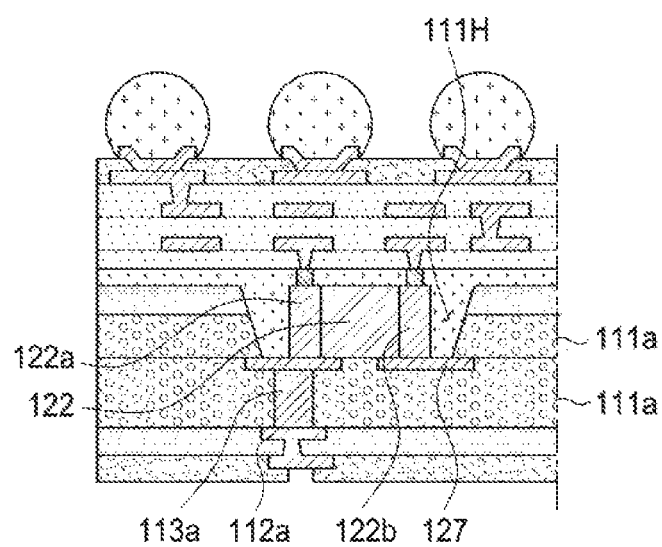

FIG. 9 is a schematic cross-sectional view illustrating an example of a fan-out semiconductor package. FIGS. 10 through 13 are schematic cross-sectional views illustrating fan-out semiconductor packages according to modified exemplary embodiments.

Referring to the drawings, a fan-out semiconductor package 100 according to an exemplary embodiment in the present disclosure may include a frame 110, first and second chips 121 and 122, an encapsulant 131, and a connection member 140. The frame 110 may have first and second recess portions 110H and 111H having different depths. In addition, the first chip 121, which is a semiconductor chip, may be disposed in the first recess portion 110H, and the second chip 122 may be disposed in the second recess portion 111H.

In addition, the fan-out semiconductor package 100 according to the exemplary embodiment may further include a first passivation layer 151 disposed on the connection member 140 and having openings exposing at least portions of a redistribution layer 142 of the connection member 140, a second passivation layer 152 disposed on the frame 110 and having openings exposing at least portions of a wiring layer 112c of the frame 110, underbump metal layers 160 disposed in the openings of the first passivation layer 151 and electrically connected to the exposed redistribution layer 142, and electrical connection structures 170 disposed on the underbump metal layers 160 and electrically connected to the exposed redistribution layer 142 through the underbump metal layers 160, if necessary.

In the present exemplary embodiment, the fan-out semiconductor package 100 may include both of the first chip 121 and the second chip 122 having different thicknesses (or heights). The first chip 121 and the second chip 122 may be disposed, respectively, in the recess portion 110H and 111H having the different depths according to the different thicknesses of the first chip 121 and the second chip 122. As such, generation of a step portion due to a thickness difference between the first chip 121 and the second chip 122 may be decreased, as compared to an example in which a thick chip and a thin chip having the same thickness difference as the first chip 121 and the second chip 122 are disposed in the same recess portion or two recess portions having the same depth. In this case, a thickness difference between portions of the encapsulant 131 respectively covering the first chip 121 and the second chip 122 may be decreased, as compared to the example in which a portion of an encapsulant covering the thick chip is significantly thinner than another portion of the encapsulant covering the thin chip. Due to such a structure including the recess portion 110H and 111H having the different depths according to the different thicknesses of the first chip 121 and the second chip 122, generation of a step portion on a surface of the encapsulant 131 may be significantly decreased, thereby improving structural stability of the fan-out semiconductor package 100. The structural stability of the fan-out semiconductor package 100 may be more important when warpage is generated in the fan-out semiconductor package 100.

The respective components included in the fan-out semiconductor package 100 according to the exemplary embodiment will hereinafter be described in more detail.

The frame 110 may improve rigidity of the fan-out semiconductor package 100 depending on certain materials, and serve to secure uniformity of a thickness of an encapsulant 131. In addition, the frame 110 may include wiring layers 112a, 112b, 112c, and 112d, and connection via layers 113a, 113b, and 113c, and thus serve as a connection member. The frame 110 may include the wiring layer 112c disposed on an inactive surface of the first chip 121, and provide a backside wiring layer for the first chip 121 and/or the second chip 122 without performing a process of forming a separate backside wiring layer.

As described above, the frame 110 may include a plurality of recess portions 110H and 111H having different depths. In this case, the first recess portion 110H may be deeper than the second recess portion 111H. In addition, upper surfaces of the first and second recess portions 110H and 111H may be disposed on the same level. Therefore, upper surfaces of the first and second chips 121 and 122 may also be arranged on substantially the same level. Unlike the first chip 121 that is the semiconductor chip, the second chip 122 may be a passive element, and the first chip 121 may be thicker than the second chip 122 as illustrated in FIG. 9. In the passive component such as a capacitor, an inductor, or the like, unlike the semiconductor chip, it may be difficult to control a thickness of the passive component by grinding a rear surface of the passive component. Therefore, when a thickness difference exists between the semiconductor chip and the passive component, it may be difficult to compensate for a step portion between surfaces of the first and second chips 121 and 122 opposing mounting surfaces thereof. In the present exemplary embodiment, such a step portion may be decreased or avoided by making depths of the recess portions 110H and 111H in which the first and second chips 121 and 122 are disposed, respectively, different from each other, based on the thickness difference between the first and second chips 121 and 122. Thus, a thickness difference between portions of the encapsulant 131 covering the surfaces of the first and second chips 121 and 122 opposing the mounting surfaces thereof may be decreased or avoided.

First and second metal layers 126 and 127 may be disposed on lower surfaces of the first and second recess portions 110H and 111H, respectively. The first and second chips 121 and 122 may be disposed on the first and second metal layers 126 and 127, respectively, and the first and second metal layers 126 and 127 may serve as etch stop layers for forming the first and second recess portions 110H and 111H, respectively. In addition, the inactive surface of the first chip 121 may be attached to the first metal layer 126 through any known adhesive member 125 such as a die attach film (DAF), or the like. The second chip 122, which is the passive element, may be disposed in the second recess portion 111H by any surface mounting process known in the related art. In this case, a conductive bonding material such as a solder, or the like, may be used, if necessary. The first stopper layer 126 may have a planar area greater than that of the inactive surface of the first chip 121. A bottom surface of the first recess portion 110H may have a planar area greater than that of the inactive surface of the first chip 121. In addition, an insulating adhesive for more stably mounting the second chip 122 may also be used. As illustrated in FIG. 9, a pair of second metal layers 127 may be provided, and may be coupled to a pair of terminals 122a and 122b of the second chip 122, respectively. Unlike, the first metal layer 126 coupled to the inactive surface of the first chip 121 may have an integral structure.

The first and second recess portions 110H and 111H may be formed by a sandblasting process as described below. In this case, the first and second recess portions 110H and 111H may have tapered shapes. That is, walls of the recess portions 110H and 111H may have predetermined gradients in relation to the metal layers 126 and 127. In this case, a process of aligning the first chip 121 may be easier, and a yield of the first chip 121 may thus be improved.

The first chip 121, which is the semiconductor chip as described above, may be an integrated circuit (IC) provided in an amount of several hundred to several million or more elements integrated in a single chip. The first chip 121 may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto.

The first chip 121 may be formed on the basis of an active wafer. In this case, a base material of a body of the first chip 121 may be silicon (Si), germanium (Ge), gallium arsenide (GaAs), or the like. Various circuits may be formed on the body. Connection pads 121P may electrically connect the first chip 121 to other components. A material of each of the connection pads 121P may be a conductive material such as aluminum (Al), or the like. A passivation layer exposing the connection pads 121P may be formed on the body, and may be an oxide film, a nitride film, or the like, or a double layer of an oxide layer and a nitride layer. An insulating layer, and the like, may also be further disposed in required positions. The first chip 121 may be a bare die, but may further include a redistribution layer formed on an active surface thereof, if necessary.

The first chip 121 may include first bumps 121B disposed on the connection pads 121P and connected to the connection pads 121P. Each of the first bumps 121B may be formed of a metal such as copper (Cu) or may be formed of a solder. As seen from a process to be described below, the fan-out semiconductor package 100 according to the exemplary embodiment may be subjected to a grinding process. In this case, a surface of a fourth wiring layer 112d of the frame 110 connected to the redistribution layer 142 may be disposed on the same level as that of a surface of each of the first bumps 121B of the first chip 121 connected to the redistribution layer 142. Upper surfaces of the encapsulant 131, the fourth wiring layer 112d, and the first bumps 121B may be coplanar with each other. In a case in which bumps are also formed on the terminals 122a and 122b of the second chip 122, upper surfaces of the bumps on the terminals 122a and 122b of the second chip 122 may be coplanar with the upper surfaces of the encapsulant 131, the fourth wiring layer 112d, and the first bumps 121B. The same level or being coplanar with each other may conceptually include a fine difference due to a process error. Therefore, a height of a connection via 143 connecting the first bump 121B to the redistribution layer 142 and a height of a connection via 143 connecting the fourth wiring layer 112d to the redistribution layer 142 may be the same as each other. The same height may conceptually include a fine difference due to a process error. When a surface on which the connection member 140 is formed is flat as described above, insulating layers 141 may be flatly formed, and the redistribution layers 142, the connection vias 143, or the like, may thus be more finely formed.

As described above, the second chip 122 may be the passive element, and an example of the passive element may include a multilayer capacitor, an inductor, a resistor, a common mode filter, or the like. However, the purpose of amounting structure using the recess portions 110H and 111H having the different depths according to the present exemplary embodiment is not to decrease only a thickness difference between the semiconductor chip and the passive element. In other words, as in a modified example of FIG. 10, a second chip 121' may be a semiconductor chip, and may have a thickness less than that of the first chip 121. In this case, the second chip 121' may also be disposed below of the recess portion 111H by an adhesive member 125', and be attached to a metal layer 126' In addition, as in a case in which the second chip is the passive component, the first recess portion 110H may be deeper than the second recess portion 111H.

The frame 110 may include a first insulating layer 111a, first and second wiring layers 112a and 112b disposed, respectively, on first and second surfaces of the first insulating layer 111a opposing each other, a second insulating layer 111b disposed on the first surface of the first insulating layer 111a and covering the first wiring layer 112a, a third wiring layer 112c disposed on the second insulating layer 111b, a third insulating layer 111c disposed on the second surface of the first insulating layer 111a and covering the second wiring layer 112b, and the fourth wiring layer 112d disposed on the third insulating layer 111c. In addition, the frame 110 may include first connection via layers 113a penetrating through the first insulating layer 111a and electrically connecting the first and second wiring layers 112a and 112b to each other, second connection via layers 113b penetrating through the second insulating layer 111b and electrically connecting the first and third wiring layers 112a and 112c to each other, and third connection via layers 113c penetrating through the third insulating layer 111c and electrically connecting the second and fourth wiring layers 112b and 112d to each other. The first to fourth wiring layers 112a, 112b, 112c, and 112d may be electrically connected to each other, and may be electrically connected to the first and second chips 121 and 122. The first recess portion 110H may penetrate through the first and third insulating layers 111a and 111c, but may not penetrate through the second insulating layer 111b. The first metal layer 126 may be disposed on the first surface of the first insulating layer 111a and be covered with the second insulating layer 111b. The first metal layer 126 may cover a bottom of the first recess portion 110H. The second recess portion 111H may penetrate through the third insulating layer 111c and into the first insulating layer 111a, but may not penetrate through the entire first insulating layer 111a. The second metal layer 127 may be disposed on a level between the first and second surfaces of the first insulating layer 111a and may include an edge portion embedded in the first insulating layer 111a. The second metal layer 127 may be disposed on a level above the first metal layer 126 with respect to the second insulating layer 111b, and may cover a bottom of the second recess portion 111H. However, according to another exemplary embodiment, the first recess portion 110H may further penetrate through another insulating layer, for example, the second insulating layer 111b, and the second recess portion 111H may penetrate through the entire first insulating layer 111a, but may not penetrate through the another insulating layer, for example, the second insulating layer 111b.

A material of each of the insulating layers 111a, 111b, and 111c may be an insulating material. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. When a material having high rigidity, such as prepreg including a glass fiber, or the like, is used as the material of each of the insulating layers 111a, 111b, and 111c, the frame 110 may be utilized as a support member for controlling warpage of the fan-out semiconductor package 100.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating resin 111a may be, for example, prepreg in which an insulating resin is impregnated together with an inorganic filler in a glass fiber, and the second insulating layer 111b and the third insulating layer 111c may be an ABF or a PID film including an inorganic filler and an insulating resin. However, the materials of the first insulating layer 111a and the second and third insulating layers 111b and 111c are not limited thereto. Similarly, the first connection via layer 113a penetrating through the first insulating layer 111a may have a diameter greater than those of the second and third connection via layers 113b and 113c respectively penetrating through the second and third insulating layers 111b and 111c.

Meanwhile, as described above, the second metal layer 127 for forming the second recess portion 111H may be disposed in the first insulating layer 111a. To this end, the first insulating layer 111a may have a multilayer structure as in a modified example of FIG. 11. Since the first insulating layer 111a has the multilayer structure, the second metal layer 127 may be easily disposed in the first insulating layer 111a. For example, the second metal layer 127 may be disposed on one of multiple layers of the multilayer structure of the insulating layer 111a and covered by another of the multiple layers of the multilayer structure of the insulating layer 111a. In this case, the second recess portion 111H may penetrate through one or more of the multiple layers of the multilayer structure of the insulating layer 111a disposed on one side of the second metal layer 127, but may not penetrate through one or more of the multiple layers of the multilayer structure of the insulating layer 111a disposed on another side of the second metal layer 127. Thicknesses and the number of layers in the multilayer structure of the first insulating layer 111a may be appropriately controlled depending on the number, depths, and the like, of recess portions 110H, 111H, and 112H.

The wiring layers 112a, 112b, 112c, and 112d may redistribute the connection pads 121P of the first chip 121, which is the semiconductor chip, and may electrically connect the first chip 121 and another chip, for example, the second chip 122 to each other together with the redistribution layers 142. A material of each of the wiring layers 112a, 112b, 112c, and 112d may be a conductive material such as copper (Cu), aluminum (Al), silver (Ag), tin (Sn), gold (Au), nickel (Ni), lead (Pb), titanium (Ti), or alloys thereof. The wiring layers 112a, 112b, 112c, and 112d may perform various functions depending on designs of corresponding layers. For example, the wiring layers 112a, 112b, 112c, and 112d may include ground patterns, power patterns, signal patterns, and the like. The first metal layer 126 may be electrically connected to the ground. Here, the signal patterns may include various signals except for the ground patterns, the power patterns, and the like, such as data signals, and the like. In addition, the wiring layers 112a, 112b, 112c, and 112d may include via pads, wire pads, electrical connection structure pads, and the like.

Thicknesses of the wiring layers 112a, 112b, 112c, and 112d may be greater than those of the redistribution layers 142 of the connection member 140. Since the frame 110 may have a thickness equal to or greater than that of the first chip 121, the wiring layers 112a, 112b, 112c, and 112d may also be formed to have large sizes. On the other hand, the redistribution layers 142 of the connection member 140 may be formed to have relatively small sizes for thinness.

The connection via layers 113a, 113b, and 113c may electrically connect the wiring layers 112a, 112b, 112c, and 112d formed on different layers to each other, resulting in an electrical path in the frame 110. A material of each of the connection via layers 113a, 113b, and 113c may be a conductive material. Each of the connection via layers 113a, 113b, and 113c may be completely filled with the conductive material, or the conductive material may also be formed along a wall of each of via holes. The first connection via layer 113a may have a cylindrical shape or a hourglass shape, and the second and third connection via layers 113b and 113c may have tapered shapes. In this case, the second and third connection via layers 113b and 113c may have tapered shapes of which directions are opposite to each other in relation to the first insulating layer 111a.

The encapsulant 131 may be filled in the recess portions 110H and 111H to protect the frame 110, the first chip 121, the second chip 122, and the like. An encapsulation form of the encapsulant 131 is not particularly limited, but may be a form in which the encapsulant 131 surrounds at least portions of the frame 110, the first chip 121, the second chip 122, and the like. For example, the encapsulant 131 may cover the frame 110 and the active surface of the first chip 121, and fill spaces between the walls of the first recess portion 110H and side surfaces of the first chip 121. The encapsulant 131 may fill the first recess portion 110H to thus serve as an adhesive and reduce buckling of the first chip 121 depending on certain materials. Likewise, the encapsulant 131 may be filled in the second recess portion 111H to encapsulate the second chip 122. In this case, regions of the encapsulant 131 covering the first and second chips 121 and 122 may be formed integrally with each other or may be separated from each other.

A material of the encapsulant 131 is not particularly limited. For example, an insulating material may be used as the material of the encapsulant 131. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a photoimagable encapsulant (PIE) resin may also be used as the insulating material.

The connection member 140 may be disposed on one surface of the frame 110, may be electrically connected to the first and second chips 121 and 122, and may include the redistribution layers 142. For example, the connection member 140 may redistribute the connection pads 121P of the first chip 121, and may electrically connect the wiring layers 112a, 112b, 112c, and 112d of the frame 110 to the connection pads 121P of the first chip 121. Several tens to several millions of connection pads 121P of the first chip 121 having various functions may be redistributed by the connection member 140, and may be physically or electrically externally connected through the electrical connection structures 170 depending on the functions. The connection member 140 may include the insulating layers 141 disposed on the frame 110 and the active surface of the first chip 121, the redistribution layers 142 disposed on the insulating layers 141, and the connection vias 143 penetrating through the insulating layers 141 and connecting the connection pads 121P, the fourth wiring layer 112d, and each of the redistribution layers 142 to each other. The numbers of insulating layers, redistribution layers, via layers of the connection member 140 may be more than or less than those illustrated in the drawing.

A material of each of the insulating layers 141 may be an insulating material. In this case, a photosensitive insulating material such as a PID resin may also be used as the insulating material. That is, each of the insulating layers 141 may be a photosensitive insulating layer. When the insulating layer 141 has photosensitive properties, the insulating layer 141 may be formed to have a smaller thickness, and a fine pitch of the connection via 143 may be achieved more easily. Each of the insulating layers 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may serve to substantially redistribute the connection pads 121P. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of corresponding layers. For example, the redistribution layers 142 may include ground patterns, power patterns, signal patterns, and the like. Here, the signal patterns may include various signals except for the ground patterns, the power patterns, and the like, such as data signals, and the like. In addition, the redistribution layers 142 may include various pad patterns, and the like.

The connection vias 143 may electrically connect the redistribution layers 142, the connection pads 121P, and the fourth wiring layer 112d, and the like, formed on different layers to each other, resulting in an electrical path in the fan-out semiconductor package 100. A material of each of the connection vias 143 may be a conductive material such as copper (Cu), aluminum (Al), silver (Ag), tin (Sn), gold (Au), nickel (Ni), lead (Pb), titanium (Ti), or alloys thereof. Each of the connection vias 143 may be completely filled with the conductive material, or the conductive material may also be formed along a wall of each of the connection vias. In addition, each of the connection vias 143 may have a tapered shape, or the like.

The first passivation layer 151 may protect the connection member 140 from external physical or chemical damage. The first passivation layer 151 may have the openings exposing at least portions of the redistribution layer 142 of the connection member 140. The number of openings formed in the first passivation layer 151 may be several tens to several millions. A material of the first passivation layer 151 is not particularly limited. For example, an insulating material may be used as the material of the first passivation layer 151. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The second passivation layer 152 may protect the frame 110 from external physical or chemical damage. The second passivation layer 152 may have the openings exposing at least portions of the third wiring layer 112c of the frame 110. The number of openings formed in the second passivation layer 152 may be several tens to several millions. A material of the second passivation layer 152 is not particularly limited. For example, an insulating material may be used as the material of the second passivation layer 152. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The underbump metal layers 160 may improve connection reliability of the electrical connection structures 170 to improve board level reliability of the fan-out semiconductor package 100. The underbump metal layers 160 may be connected to the redistribution layer 142 of the connection member 140 exposed through the openings of the first passivation layer 151. The underbump metal layers 160 may be formed in the openings of the first passivation layer 151 by any known metallization method using any known conductive material such as a metal, but are not limited thereto.

The electrical connection structures 170 may physically or electrically externally connect the fan-out semiconductor package 100. For example, the fan-out semiconductor package 100 may be mounted on the mainboard of the electronic device through the electrical connection structures 170. Each of the electrical connection structures 170 may be formed of a conductive material, for example, a solder, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 121P, or may be provided in an amount of several tens to several thousands or more or several tens to several thousands or less. When the electrical connection structures 170 are solder balls, the electrical connection structures 170 may cover side surfaces of the underbump metal layers 160 extending onto one surface of the first passivation layer 151, and connection reliability may be more excellent.

At least one of the electrical connection structures 170 may be disposed in a fan-out region. The fan-out region refers to a region except for a region in which the first chip 121 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Meanwhile, although not illustrated in the drawings, a metal thin film may be formed on the walls of the first and second recess portions 110H and 111H, if necessary, in order to dissipate heat and/or block electromagnetic waves. In addition, a plurality of first chips 121 or second chips 122 performing functions that are the same as or different from each other may be disposed in the first and second recess portions 110H and 111H, if necessary. In addition, passive components, for example, surface mounting technology (SMT) components including an inductor, a capacitor, or the like, may be disposed on surfaces of the first and second passivation layers 151 and 152, if necessary.

Figure 12:
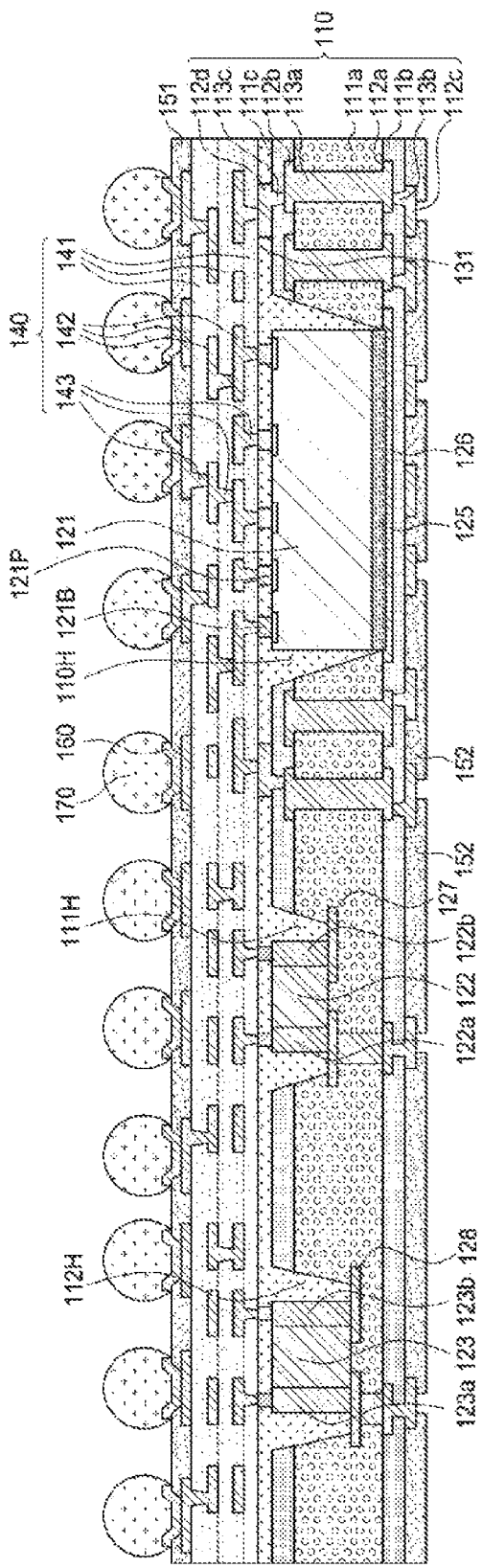

Meanwhile, unlike the exemplary embodiment described above, a fan-out semiconductor package may include a plurality of passive elements having different thicknesses, which will be described with reference to a modified example of FIG. 12. As illustrated in FIG. 12, a fan-out semiconductor package may further include a third recess portion 112H, in addition to the first and second recess portions 110H and 111H, and include a third chip 123 disposed in the third recess portion 112H. The third chip 123 may be a passive element having a pair of terminals 123a and 123b or may be a semiconductor chip. In addition, metal layers 128 may be disposed below of the third recess portion 112H, similar to the first and second recess portions 110H and 111H.

The third recess portion 112H may have a depth different from those of the first and second recess portions 110H and 111H. In detail, the third recess portion 112H may have an intermediate depth, the first recess portion 110H may be deeper than the third recess portion 112H, and the third recess portion 112H may be deeper than the second recess portion 111H. In this case, the third chip 123 disposed in the third recess portion 112H may be thicker than the second chip 122. As in the present modified example, the fan-out semiconductor package may include the recess portions 110H, 111H, and 112H having various depths to effectively accommodate the chips 121, 122, and 123 having various thicknesses, and may decrease an influence due to a thickness difference among the chips 121, 122, and 123.

Figure 13:
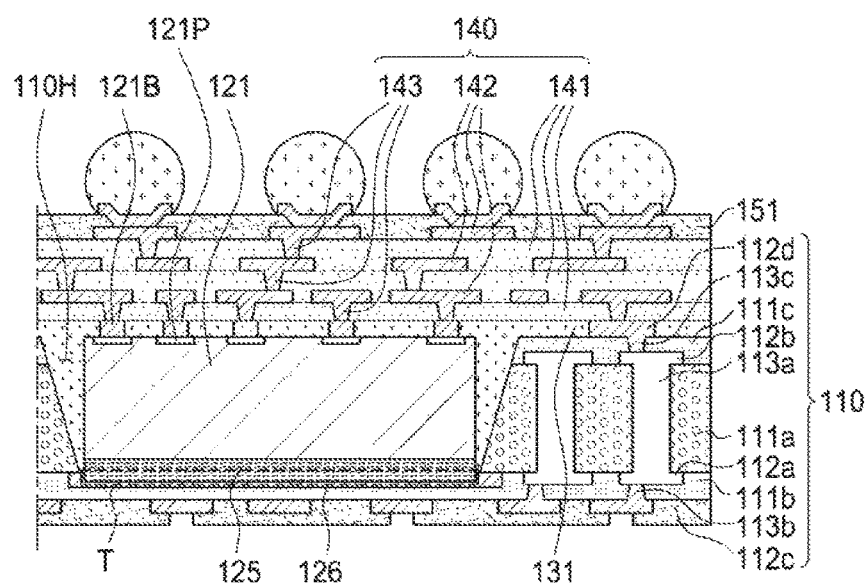

FIG. 13 illustrates a fan-out semiconductor package according to another modified example, and illustrates only the surrounding of the first chip 121. In the present modified example, grooves T may be formed in a surface of a first metal layer 126 adjacent to the first chip 121. An adhesive member 125, or the like, may be filled in the grooves T. The grooves T of the first metal layer 126 may be formed by removing portions of the first metal layer 126 by a sandblasting process, or the like, at the time of processing the recess portion 110H. The first chip 121 may have higher structural stability by the grooves T. In addition, grooves may also be formed in surfaces of the metal layers 126', 127, and 128 described above in the abovementioned exemplary embodiments, similar to the first metal layer 126.

FIGS. 14 through 17 are schematic views illustrating processes of manufacturing a fan-out semiconductor package according to an exemplary embodiment in the present disclosure. Structural features of the fan-out semiconductor package having the structure described above may be more clearly understood from a description for processes of manufacturing a fan-out semiconductor package. In a description for the processes of manufacturing a fan-out semiconductor package, a surrounding region of the first chip 121 is illustrated and described, but processes of disposing the second and third chips 122 and 123 may be performed in the same manner.

Figure 14:
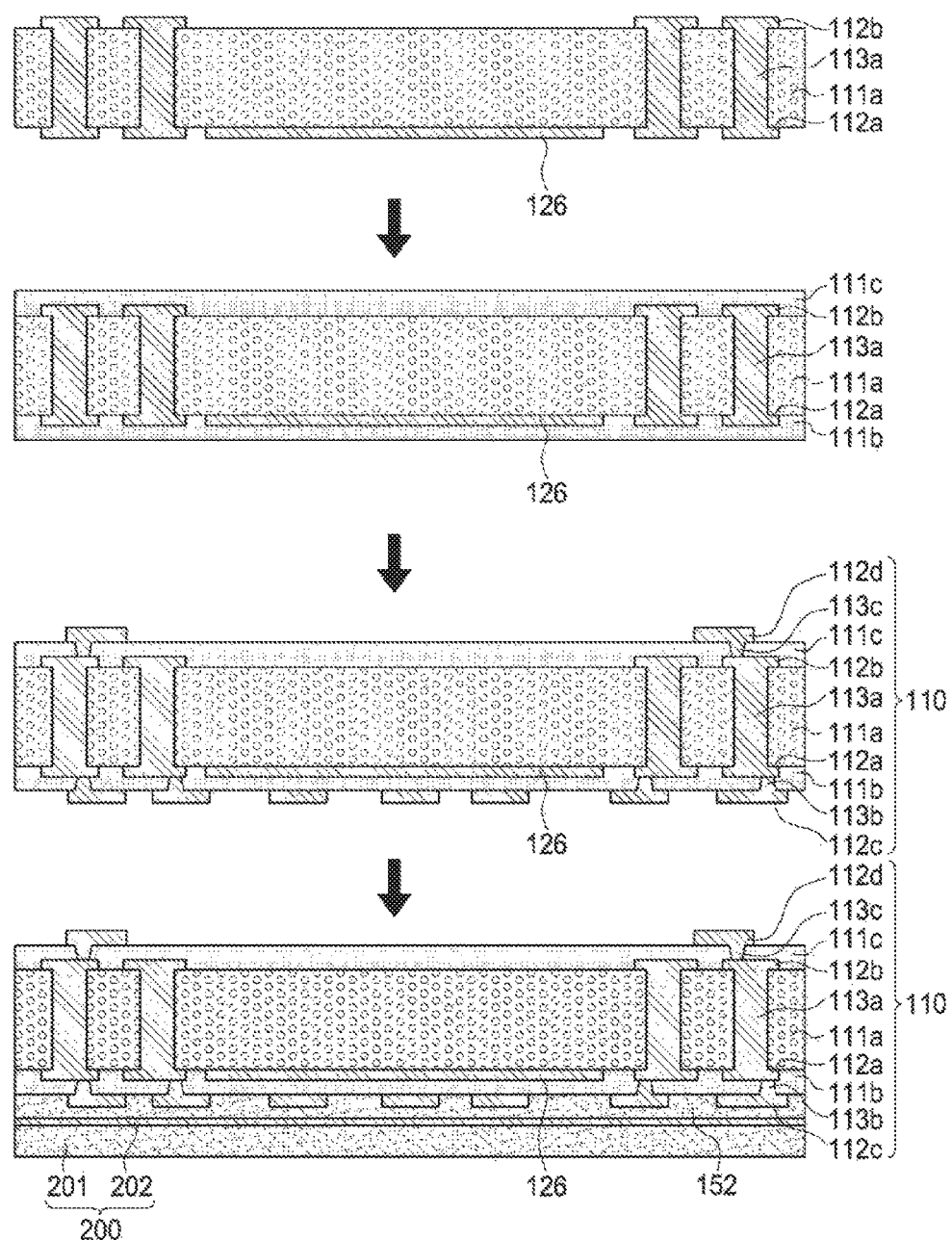
FIGS. 14 through 17 are schematic views illustrating processes of manufacturing a fan-out semiconductor package according to an exemplary embodiment in the present disclosure.

First, referring to FIG. 14, the first insulating layer 111a may be prepared using a copper clad laminate (CCL), or the like, and the first and second wiring layers 112a and 112b, the first metal layer 126, and the first connection via layers 113a may be formed on and in the first insulating layer 111a by any known plating process. Via holes for the first connection via layers 113a may be formed using mechanical drilling, laser drilling, or the like. Then, the second and third insulating layers 111b and 111c may be formed on opposite surfaces of the first insulating layer 111a, respectively. The second and third insulating layers 111b and 111c may be formed by laminating and then hardening an ABF, or the like. Then, the third and fourth wiring layers 112c and 112d and the second and third connection via layers 113b and 113c may be formed on and in the second and third insulating layers 111b and 111c, respectively, by any known plating process. Via holes for the second and third connection via layers 113b and 113c may also be formed using mechanical drilling, laser drilling, or the like. The second passivation layer 152 may be attached to a first surface of the frame 110 prepared by a series of processes, and a carrier film 200 such as a DCF, including an insulating layer 201 and a metal layer 202 may be attached to the second passivation layer 152.

Figure 15:
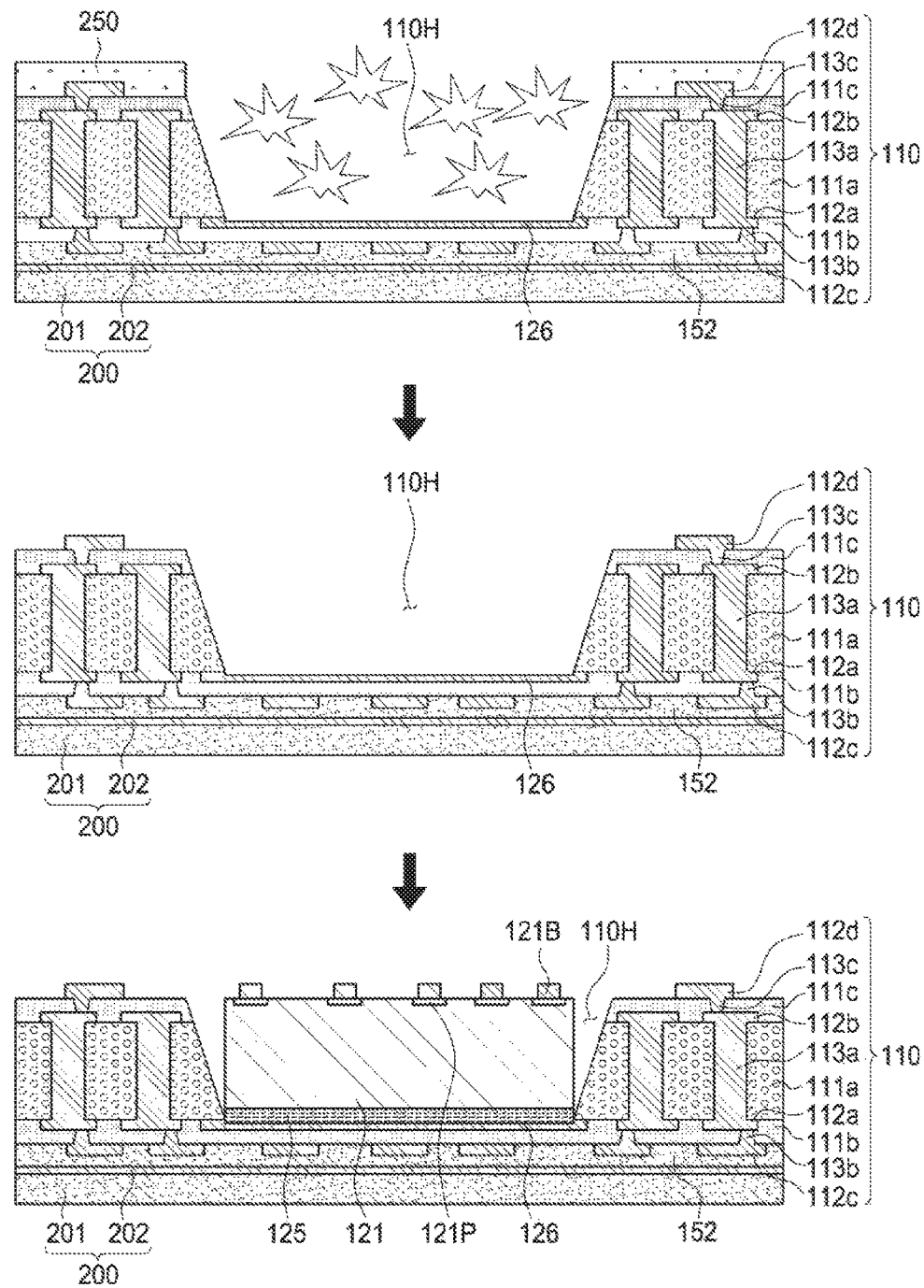

Then, as illustrated in FIG. 15, a dry film 250 such as a DFR may be attached to the other surface of the frame 110, and the first recess portion 110H penetrating through the first and third insulating layers 111a and 111c may be formed by a sandblasting process. In this case, the first metal layer 126 may serve as an etch stop layer. The formed first recess portion 110H may have the tapered shape. When the first recess portion 110H is formed, the dry film 250 may be removed, and the first chip 121 may be disposed in the first recess portion 110H so that the inactive surface is attached to the first metal layer 126. Any known adhesive member 125 such as a DAF may be used to attach the inactive surface to the first metal layer 126. Meanwhile, the first chip 121 may be attached in a state in which the first bumps 121B such as copper (Cu) pillars are formed on the connection pads 121P.

Figure 16:
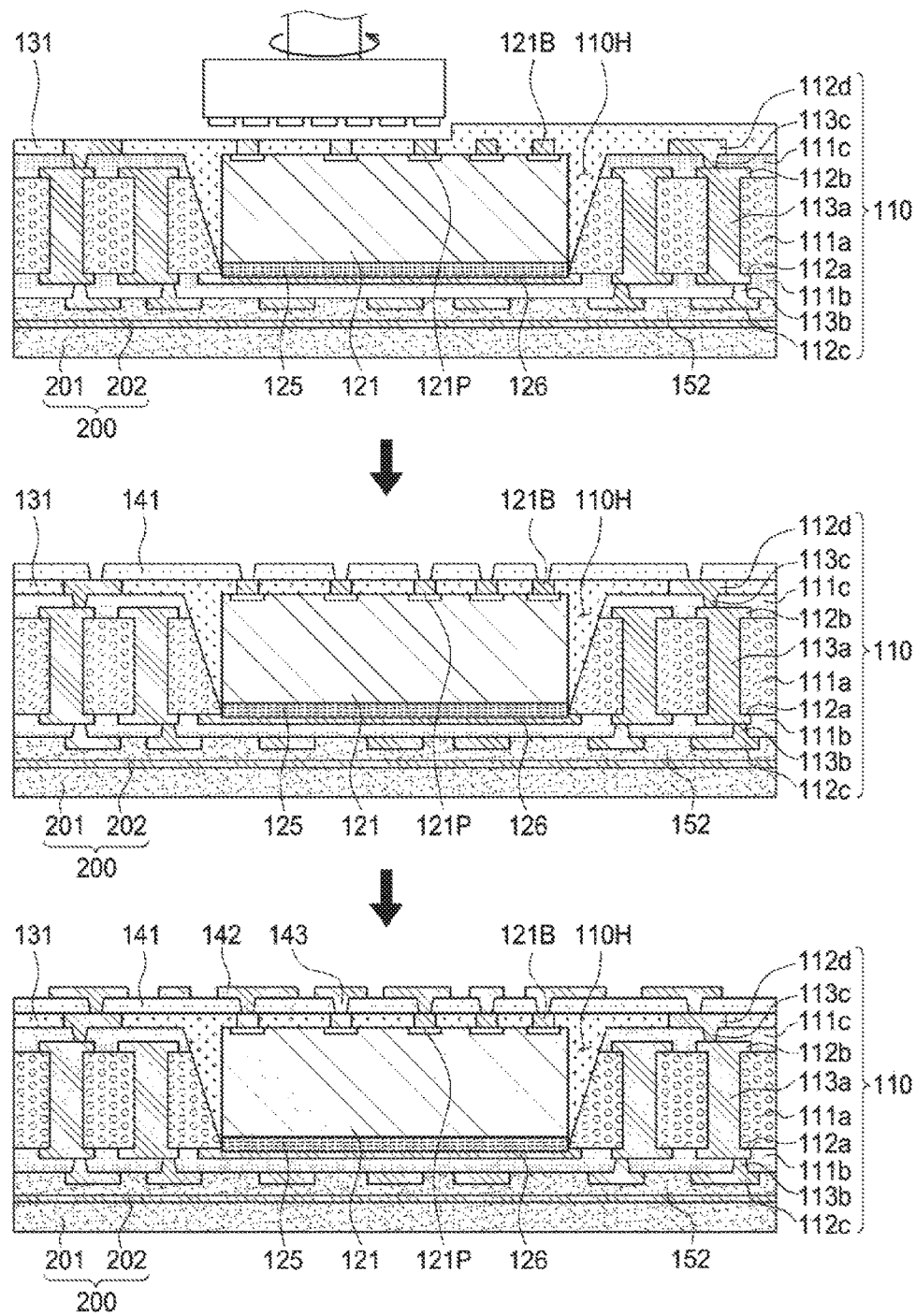

Then, as illustrated in FIG. 16, at least portions of the frame 110 and the first chip 121 may be encapsulated using the encapsulant 131. The encapsulant 131 may be formed by laminating and then hardening an ABF, or the like. Then, the encapsulant 131 may be grinded so that a surface of the fourth wiring layer 112d and surfaces of the first bumps 121B are exposed. A surface of the encapsulant 131 may become flat by the grinding, and the surfaces of the first bumps 121B and the surface of the fourth wiring layer 112d may be exposed from the encapsulant 131. Then, a photosensitive material, or the like, may be applied to the encapsulant 131 and be then hardened to form the insulating layer 141, and the redistribution layer 142 and the connection vias 143 may be formed on and in the insulating layer 131 by a plating process.

Figure 17:
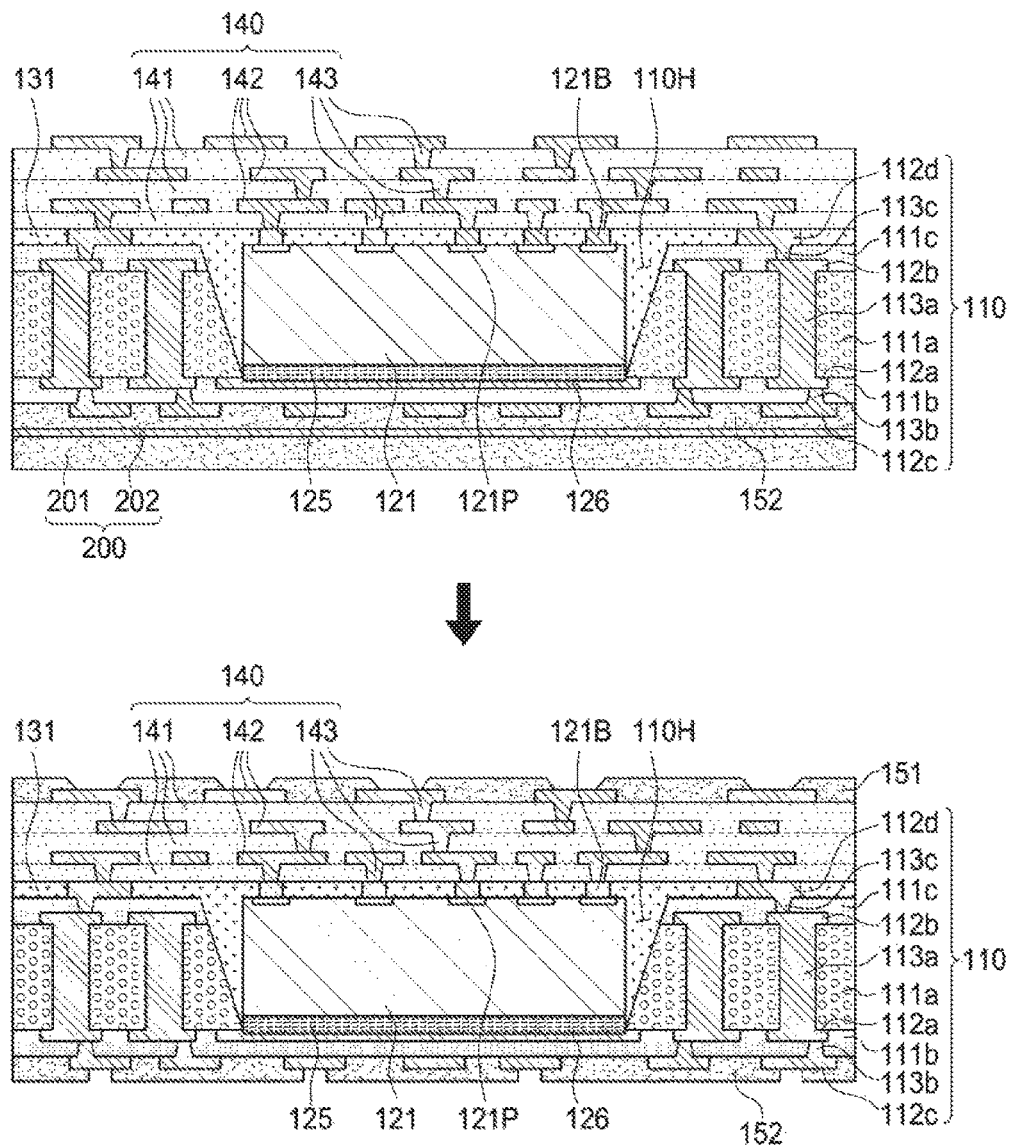

Then, as illustrated in FIG. 17, larger numbers of insulating layers 141, redistribution layers 142, and connection layer layers 143 may be formed depending on a design. The connection member 140 may be formed by a series of processes. Then, the first passivation layer 151 may be formed on the connection member 140 by laminating and then hardening an ABF, or the like, and the carrier film 200 may be removed. Then, the underbump metal layers 160 may be formed by any known metallization method, and the electrical connection structures 170 may be formed by a reflow process, or the like, using solder balls, or the like, to obtain the fan-out semiconductor package 100 as illustrated in FIG. 9.

As set forth above, according to the exemplary embodiments in the present disclosure, a fan-out semiconductor package of which structural stability may be improved even though a plurality of chips having different thicknesses are used together may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a frame including a plurality of insulating layers, a plurality of wiring layers disposed on the plurality of insulating layers, and a plurality of connection via layers penetrating through the plurality of insulating layers and electrically connecting the plurality of wiring layers to each other, and having a first recess portion and a first stopper layer disposed on a bottom surface of the first recess portion;
a semiconductor chip disposed in the first recess portion and having connection pads, an active surface on which the connection pads are disposed, and an inactive surface opposing the active surface and disposed on the first stopper layer;
an encapsulant covering at least portions of the semiconductor chip and filling at least portions of the first recess portion; and
a connection member disposed on the frame and the active surface of the semiconductor chip and including a redistribution layer electrically connecting the plurality of wiring layers of the frame and the connection pads of the semiconductor chip to each other.

2. The fan-out semiconductor package of claim 1, wherein the frame further includes a second recess portion spaced apart from the first recess portion and a second stopper layer disposed on a bottom surface of the second recess portion,
the fan-out semiconductor package further comprises a first electronic component disposed in the second recess portion and having a lower surface disposed on the second stopper layer, and
the first electronic component is electrically connected to the connection pads of the semiconductor chip through the redistribution layer of the connection member.

3. The fan-out semiconductor package of claim 2, wherein upper surfaces of the first and second recess portions respectively opposing the bottom surfaces of the first and second recess portions are coplanar with each other.

4. The fan-out semiconductor package of claim 2, wherein the first electronic component is a passive component or another semiconductor chip,
   the first recess portion has a depth greater than that of the second recess portion, and
   the semiconductor chip has a thickness greater than that of the first electronic component.

5. The fan-out semiconductor package of claim 2, wherein the first stopper layer is a metal layer having an integral structure, and the second stopper layer is a pair of metal layers spaced apart from each other.

6. The fan-out semiconductor package of claim 2, wherein the frame further has a third recess portion spaced apart from the first and second recess portions and a third stopper layer disposed on a bottom surface of the third recess portion,
   the fan-out semiconductor package further comprises a second electronic component disposed in the third recess portion and having a lower surface disposed on the third stopper layer, and
   the second electronic component is electrically connected to the connection pads of the semiconductor chip through the redistribution layer of the connection member.

7. The fan-out semiconductor package of claim 6, wherein each of the first and second electronic components is a passive component,
   the third recess portion has a depth greater than that of the second recess portion,
   the first recess portion has a depth greater than that of the third recess portion,
   the semiconductor chip has a thickness greater than that of the second electronic component, and
   the second electronic component has a thickness greater than that of the first electronic component.

8. The fan-out semiconductor package of claim 1, wherein the plurality of insulating layers include a core insulating layer, one or more first build-up insulating layers disposed on a lower surface of the core insulating layer, and one or more second build-up insulating layers disposed on an upper surface of the core insulating layer opposing the lower surface, and
   the core insulating layer has a thickness greater than that of each of the first and second build-up insulating layers.

9. The fan-out semiconductor package of claim 8, wherein the number of first build-up insulating layers and the number of second build-up insulating layers are the same as each other.

10. The fan-out semiconductor package of claim 8, wherein the first recess portion penetrates through at least the core insulating layer and penetrates through at least one of the second build-up insulating layers.

11. The fan-out semiconductor package of claim 8, wherein the frame further includes first connection vias penetrating through the first build-up insulating layer and second connection vias penetrating through the second build-up insulating layer and tapered in opposite directions to each other.

12. The fan-out semiconductor package of claim 1, wherein the first stopper layer is a metal layer,
   at least one of the plurality of wiring layers includes a ground, and
   the metal layer is electrically connected to the ground.

13. The fan-out semiconductor package of claim 1, wherein the inactive surface of the semiconductor chip is attached to the first stopper layer through an adhesive member.

14. The fan-out semiconductor package of claim 1, wherein walls of the first recess portion are tapered.

15. The fan-out semiconductor package of claim 1, wherein the first stopper layer has a planar area greater than that of the inactive surface of the semiconductor chip.

16. The fan-out semiconductor package of claim 1, wherein the bottom surface of the first recess portion has a planar area greater than that of the inactive surface of the semiconductor chip.

17. The fan-out semiconductor package of claim 1, wherein a region of the first stopper layer exposed by the first recess portion has a thickness less than that of an edge region of the first stopper layer that is not exposed by the first recess portion.

18. The fan-out semiconductor package of claim 1, wherein metal bumps are disposed on the connection pads of the semiconductor chip, and
   upper surfaces of the metal bumps are coplanar with an upper surface of the encapsulant.

19. The fan-out semiconductor package of claim 18, wherein an upper surface of an uppermost wiring layer of the plurality of wiring layers of the frame or an upper surface of an uppermost connection via layer of the plurality of connection via layers is coplanar with the upper surfaces of the metal bumps and the upper surface of the encapsulant.

20. The fan-out semiconductor package of claim 1, further comprising:
   a first passivation layer disposed on the connection member and having openings exposing at least portions of the redistribution layer;
   underbump metal layers disposed in the openings of the first passivation layer and connected to at least portions of the exposed redistribution layer; and
   electrical connection structures disposed on the first passivation layer and connected to the underbump metal layers.

21. The fan-out semiconductor package of claim 20, further comprising a second passivation layer disposed below of the frame and having openings exposing at least portions of a lowermost wiring layer of the plurality of wiring layers.

22. The fan-out semiconductor package of claim 1, wherein at least one of the wiring layers are disposed on the level below the first stopper layer.

* * * * *